(12) United States Patent
Ohno et al.

(10) Patent No.: US 7,541,408 B2
(45) Date of Patent: Jun. 2, 2009

(54) CURABLE RESIN COMPOSITION, CURABLE FILM AND CURED FILM

(75) Inventors: Daisuke Ohno, Tokyo (JP); Kenji Ishii, Tokyo (JP); Yasumasa Norisue, Tokyo (JP)

(73) Assignee: Mitsubishi Gas Chemical Company, Inc., Tokyo (JP)

( * ) Notice: Subject to any disclaimer, the term of this patent is extended or adjusted under 35 U.S.C. 154(b) by 339 days.

(21) Appl. No.: 11/204,320

(22) Filed: Aug. 16, 2005

(65) Prior Publication Data
US 2006/0041068 A1 Feb. 23, 2006

(30) Foreign Application Priority Data
Aug. 19, 2004 (JP) ............................. 2004/239068
Jul. 4, 2005 (JP) ............................. 2005/194942

(51) Int. Cl.
*C08L 53/02* (2006.01)
(52) U.S. Cl. ..................... 525/88; 525/92 D; 525/98; 525/99
(58) Field of Classification Search .............. 525/98, 525/99, 92 D, 88
See application file for complete search history.

(56) References Cited

U.S. PATENT DOCUMENTS

| | | | | |
|---|---|---|---|---|
| 2005/0042466 A1* | 2/2005 | Ohno et al. | ................ | 428/457 |
| 2007/0129502 A1* | 6/2007 | Kawabe et al. | ............. | 525/391 |
| 2007/0257401 A1* | 11/2007 | Nakagawa et al. | ....... | 264/328.1 |

FOREIGN PATENT DOCUMENTS

| | | |
|---|---|---|
| EP | 0 546 497 A2 | 6/1993 |
| EP | 0 546 497 A3 | 6/1993 |
| EP | 1 384 733 A1 | 1/2004 |
| WO | WO 2005/073264 * | 8/2005 |

OTHER PUBLICATIONS

Ishii, electronic translation of JP2003-155340, May 2003.*
Kawahata, CAPLUS AN 2005:340554, Apr. 2005.*
Kawabata, CAPLUS AN 2005:340555, Apr. 2005.*
Ishii, electronic translation of JP 2003-183350, Jul. 2003.*

* cited by examiner

*Primary Examiner*—Jeffrey C Mullis
(74) *Attorney, Agent, or Firm*—Wenderoth, Lind & Ponack, L.L.P.

(57) ABSTRACT

A curable resin composition containing as essential components a high molecular weight compound having a weight average molecular weight of at least 10,000 and a vinyl compound of the formula (1).

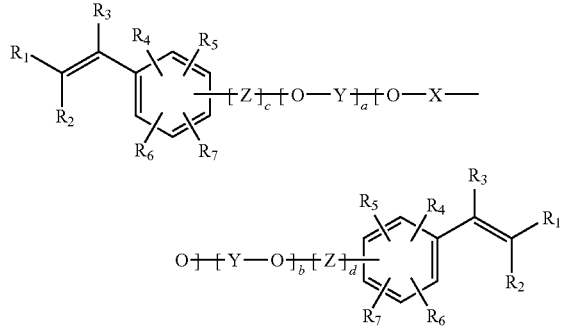

7 Claims, No Drawings

CURABLE RESIN COMPOSITION, CURABLE FILM AND CURED FILM

FIELD OF THE INVENTION

The present invention relates to a curable resin composition which is excellent in low dielectric characteristics and heat resistance and is capable of giving a curable film having no tackiness and good workability, a curable film using the above curable resin composition and a film obtained by curing the above curable film. The curable film or the film of the present invention is suitably used as an electrical insulating material for a high-frequency use, etc.

BACKGROUNDS OF THE INVENTION

In recent years, the signal band of information communication devices such as PHS or portable telephones and the CPU clock time of computers reach to a GHz band and higher frequencies are coming to be used. The dielectric loss of electric signals is proportional to the product of the square root of dielectric constant of an insulator forming a circuit, the dielectric loss tangent thereof and the frequency of signals to be used. Therefore, as the frequency of signals to be used becomes higher, the dielectric loss increases. The dielectric loss damps electrical signals and impairs the reliability of the signals. For inhibiting the above impairment, it is required to select a material having a small dielectric constant and a small dielectric loss tangent as an insulator. As such a material, a fluorine-contained resin, a polyolefin resin, a polystyrene resin, a polyphenylene ether resin, etc., are proposed. However, although these resins are excellent in low dielectric characteristics, most of them have a problem about chemical resistance or moldability. With regard to films made of these resins for electrical insulating materials, for example, a film made of polyphenylene ether have a problem about flexibility (for example, JP-A-7-188362), and a film made of a low molecular weight styrene compound such as divinylbenzene is apt to have tackiness and a cured product obtained is apt to be fragile (for example JP-A-2002-249531). Further, the present inventors have developed vinyl compound derivatives of bifunctional polyphenylene ether oligomers for meeting a demand for low dielectric characteristics (for example, JP-A-2004-059644). These derivatives are excellent in low dielectric characteristics. However, when films are obtained from these derivatives, a crack is apt to occur. Therefore, an improvement is required.

SUMMARY OF THE INVENTION

It is an object of the present invention to provide a curable resin composition which is capable of giving a curable film having no tackiness, has a low dielectric constant and a low dielectric loss tangent and is capable of giving a cured product having excellent heat resistance, a curable film using the curable resin composition and a film obtained by curing the curable film.

According to the present invention, there is provided a curable resin composition containing as essential components a vinyl compound of the formula (1) and a high molecular weight compound having a weight average molecular weight of at least 10,000.

According to the present invention, there is further provided a curable film obtained by processing the above curable resin composition into a film form.

According to the present invention, there is still further provided a film obtained by curing the above curable film.

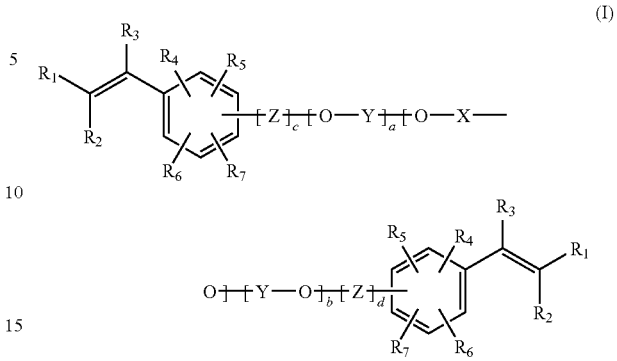

wherein $R_1$, $R_2$, $R_3$, $R_4$, $R_5$, $R_6$ and $R_7$ are the same or different and represent a hydrogen atom, a halogen atom, an alkyl group or a halogenated alkyl group, —(O—X—O)— represents a moiety of the formula (2) or the formula (3) or represents at least two kinds of moieties of the formula (2) and/or the formula (3),

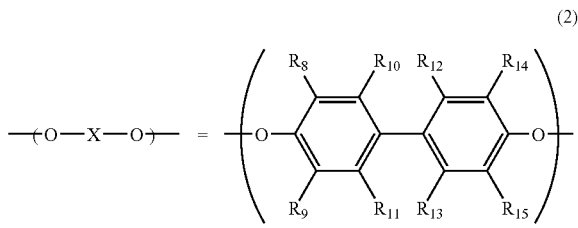

in which $R_8$, $R_9$, $R_{10}$, $R_{14}$ and $R_{15}$ are the same or different and represent a halogen atom, an alkyl group having 6 or less carbon atoms or a phenyl group and $R_{11}$, $R_{12}$ and $R_{13}$ are the same or different and represent a hydrogen atom, a halogen atom, an alkyl group having 6 or less carbon atoms or a phenyl group,

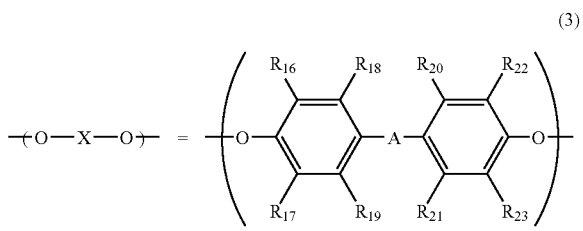

in which $R_{16}$, $R_{17}$, $R_{22}$ and $R_{23}$ are the same or different and represent a halogen atom, an alkyl group having 6 or less carbon atoms or a phenyl group, $R_{18}$, $R_{19}$, $R_{20}$ and $R_{21}$, are the same or different and represent a hydrogen atom, a halogen atom, an alkyl group having 6 or less carbon atoms or a phenyl group and A is a linear, branched or cyclic hydrocarbon having 20 or less carbon atoms, —(Y—O)— represents a moiety of the formula (4) or a random arrangement of at least two kinds of moieties of the formula (4),

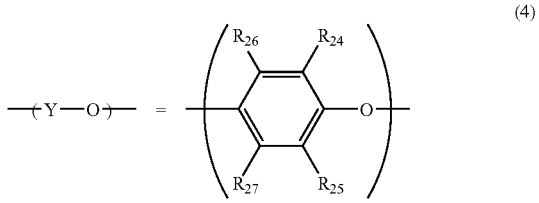

(4)

in which $R_{24}$ and $R_{25}$ are the same or different and represent a halogen atom, an alkyl group having 6 or less carbon atoms or a phenyl group and $R_{26}$ and $R_{27}$ are the same or different and represent a hydrogen atom, a halogen atom, an alkyl group having 6 or less carbon atoms or a phenyl group, Z represents an organic group having at least one carbon atom which may contain an oxygen atom, a nitrogen atom, a sulfur atom and/or a halogen atom, each of a and b is an integer of from 0 to 30, provided that at least one of a and b is not 0, and each of c and d is an integer of 0 or 1.

EFFECT OF THE INVENTION

The curable film or coating film having no tackiness is obtained by using the curable resin composition of the present invention. The film obtained by curing the curable film or coating film has low dielectric characteristics and high heat resistance so that it is expected to be used in an insulating material for electric parts for high frequencies, an insulating material for semiconductors, a buildup printed wiring board material, a coating material, a coating, an adhesive, a film for condensers, etc. Therefore, the industrial significance thereof is remarkably considerable.

DETAILED DESCRIPTION OF THE INVENTION

The present inventors have made diligent studies for attaining the foregoing object and as a result found that a curable film having no tackiness which is capable of giving a cured product having a low dielectric constant and a low dielectric loss tangent is obtained by using a resin composition obtained by incorporating a high molecular weight compound having a weight average molecular weight of at least 10,000 into a terminal vinyl compound of a bifunctional phenylene ether oligomer inheriting excellent dielectric characteristics and high heat resistance from a polyphenylene ether structure and having a specific structure. On the basis of the above finding, the present inventors have completed the present invention.

The vinyl compound of the formula (1) used in the curable resin composition of the present invention is not specially limited so long as it is selected from vinyl compounds of the formula (1) wherein $R_1$, $R_2$, $R_3$, $R_4$, $R_5$, $R_6$ and $R_7$ are the same or different and represent a hydrogen atom, a halogen atom, an alkyl group or a halogenated alkyl group; —(O—X—O)— represents a moiety of the formula (2) or the formula (3) or represents at least two kinds of moieties of the formula (2) and/or the formula (3) wherein $R_8$, $R_9$, $R_{10}$, $R_{14}$, $R_{15}$, $R_{16}$, $R_{17}$, $R_{22}$ and $R_{23}$ are the same or different and represent a halogen atom, an alkyl group having 6 or less carbon atoms or a phenyl group, $R_{11}$, $R_{12}$, $R_{13}$, $R_{18}$, $R_{19}$, $R_{20}$ and $R_{21}$ are the same or different and represent a hydrogen atom, a halogen atom, an alkyl group having 6 or less carbon atoms or a phenyl group and A is a linear, branched or cyclic hydrocarbon having 20 or less carbon atoms; —(Y—O)— represents a moiety of the formula (4) or a random arrangement of at least two kinds of moieties of the formula (4) wherein $R_{24}$ and $R_{25}$ are the same or different and represent a halogen atom, an alkyl group having 6 or less carbon atoms or a phenyl group and $R_{26}$ and $R_{27}$ are the same or different and represent a hydrogen atom, a halogen atom, an alkyl group having 6 or less carbon atoms or a phenyl group; Z represents an organic group having at least one carbon atom which may contain an oxygen atom, a nitrogen atom, a sulfur atom and/or a halogen atom; each of a and b is an integer of from 0 to 30, provided that at least one of a and b is not 0; and each of c and d is an integer of 0 or 1. Of these vinyl compounds of the formula (1), preferable is a vinyl compound wherein $R_1$, $R_2$, $R_3$, $R_4$, $R_5$, $R_6$ and $R_7$ are hydrogen atoms, $R_8$, $R_9$, $R_{10}$, $R_{14}$, $R_{15}$, $R_{16}$, $R_{17}$, $R_{22}$ and $R_{23}$ are alkyl groups having 3 or less carbon atoms, $R_{11}$, $R_{12}$, $R_{13}$, $R_{18}$, $R_{19}$, $R_{20}$ and $R_{21}$ are hydrogen atoms or alkyl groups having 3 or less carbon atoms, Z is a methylene group, and each of c and d is 1. Particularly preferable is a vinyl compound wherein —(O—X—O)— represented by the formula (2) or the formula (3) is a moiety of the formula (5) or the formula (6) and —(Y—O)— represented by the formula (4) is a moiety of the formula (7) or the formula (8) or a random arrangement of moieties of the formula (7) and the formula (8).

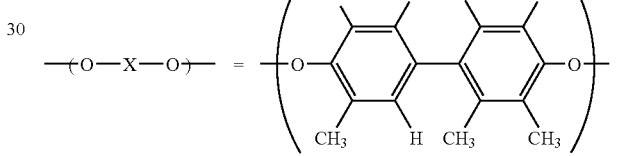

(5)

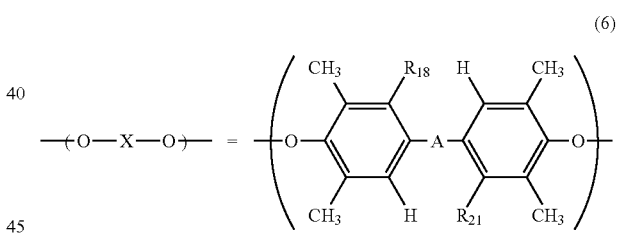

(6)

in which $R_{18}$ and $R_{21}$ represent a hydrogen atom or a methyl group, and A is a linear, branched or cyclic hydrocarbon having 20 or less carbon atoms.

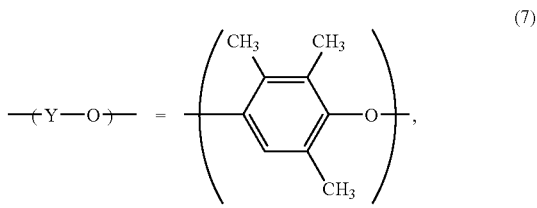

(7)

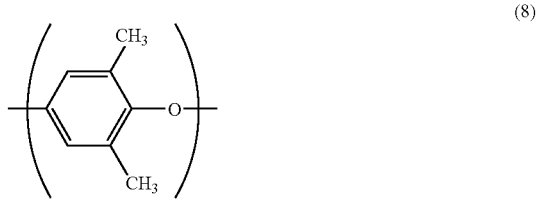

(8)

The vinyl compound of the formula (1) preferably has a number average molecular weight of from 500 to 3,000. When the number average molecular weight is smaller than 500, a curable film having tackiness is apt to be obtained. When it is larger than 3,000, the solubility of the vinyl compound in a solvent decreases. The process for producing the vinyl compound is not specially limited. For example, the vinyl compound can be produced by the method disclosed in JP-A-2004-59644 or JP-A-2004-67727.

The amount of the vinyl compound of the formula (1) in the curable resin composition of the present invention is not specially limited. However, the amount of the vinyl compound is too small, it is impossible to obtain intended low dielectric characteristics, heat resistance, tackiness and curing properties. Accordingly, the amount of the vinyl compound of the formula (1) in the curable resin composition is preferably from 5 wt % to 95 wt %, more preferably from 20 wt % to 85 wt %.

The high molecular weight compound having a weight average molecular weight of at least 10,000 used in the curable resin composition of the present invention is preferably able to impart a film-forming ability without impairing the low dielectric characteristics and heat resistance of the vinyl compound of the formula (1). Specific examples of such a high molecular weight compound include butadiene elastomers such as a styrene butadiene copolymer (SBR) and an acrylonitrile butadiene copolymer; styrene thermoplastic elastomers such as a styrene butadiene styrene copolymer (SBS), a hydrogenated styrene butadiene styrene copolymer, a styrene isoprene styrene copolymer (SIS), a hydrogenated styrene isoprene styrene copolymer and a hydrogenated styrene (butadiene/isoprene) styrene copolymer; and thermoplastic resins such as polystyrene, polyester and polycarbonate. These high molecular weight compounds may be used alone or in combination. Of these high molecular weight compounds, the styrene thermoplastic elastomers such as a styrene butadiene styrene copolymer, a hydrogenated styrene butadiene styrene copolymer, a styrene isoprene styrene copolymer, a hydrogenated styrene isoprene styrene copolymer and a hydrogenated styrene (butadiene/isoprene) styrene copolymer are preferable. In particular, the styrene isoprene styrene copolymer, the hydrogenated styrene butadiene styrene copolymer, the hydrogenated styrene isoprene styrene copolymer and the hydrogenated styrene (butadiene/isoprene) styrene copolymer are more preferable since these copolymers can give higher heat resistance.

When the styrene thermoplastic elastomer is used, the styrene content in the elastomer is not specially limited. When a higher heat resistance is desired, the styrene content in the elastomer is preferably from 10 to 70 wt %, more preferably from 20 to 50 wt %. Further, the weight average molecular weight of the styrene thermoplastic elastomer is not specially limited so long as it is at least 10,000. When it is too large, it is difficult to mix the styrene thermoplastic elastomer with the vinyl compound. For this reason, it is preferably 10,000 to 300,000.

In the curable resin composition of the present invention, the mixing ratio of the vinyl compound of the formula (1) to the high molecular weight compound is not specially limited. However, when the amount of the high molecular weight compound is too large, intended heat resistance and curability cannot be obtained. When the amount of the high molecular weight compound is too small, the film-forming ability descends. Therefore, the weight ratio of the vinyl compound of the formula (1): the high molecular weight compound is preferably from 20:80 to 95:5, more preferably from 30:70 to 85:15.

The curable resin composition of the present invention undergoes curing itself under heat. For the purpose of increasing its curing rate and thus improving workability and economic performances, etc., a heat-curing catalyst can be incorporated into the curable resin composition. The heat-curing catalyst are selected from those heat-curing catalysts which are capable of generating cationic or radical active species, which can initiate polymerization of a vinyl group, with heat or light. For example, a cationic polymerization initiator includes a diallyl iodonium salt, a triallyl sulfonium salt and an aliphatic sulfonium salt, which use $BF_4$, $PF_6$, $AsF_6$ or $SbF_6$ as a pairing anion. These cationic polymerization initiators are easily available as a commercially available product such as SP70, SP172 and CP 66, supplied by Asahi Denka Kogyo K.K., CI2855 and CI2823 supplied by Nippon Soda Co., Ltd., and SI100L and SI150L supplied by Sanshin Chemical Industry Co., Ltd. A radical polymerization initiator includes benzoin compounds such as benzoin and benzoin methyl, acetophenone compounds such as acetophenone and 2,2-dimethoxy-2-phenylacetophenone, thioxanthone compounds such as thioxanthone and 2,4-diethylthioxanthone, bisazido compounds such as 4,4'-diazidochalcone, 2,6-bis(4'-azidobenzal)cyclohexanone and 4,4'-diazidobenzophenone, azo compounds such as azobisisobutyronitrile, 2,2-azobispropane and hydrazone, organic peroxides such as 2,5-dimethyl-2,5-di(t-butylperoxy)hexane, 2,5-dimethyl-2,5-di(t-butylperoxy)hexyne-3 and dicumyl peroxide. These curing catalysts can be used alone or in combination.

A polymerization inhibitor may be incorporated into the curable resin composition of the present invention for increasing its preservation stability. The polymerization inhibitor may be selected from generally known polymerization inhibitors. Examples thereof include quinones such as hydroquinone, methyl hydroquinone, p-benzoquinone, chloranil and trimethylquinone, and aromatic diols. These polymerization inhibitors may be used alone or in combination.

The curable resin composition of the present invention may further contain a known flame-retardant, a filler, a coupling agent, a thermosetting resin, a dye, a pigment, a thickener, a lubricant, an antifoamer, an ultraviolet absorber, etc., for adjusting its physical properties, as required.

The flame-retardant may be selected from generally-known flame-retardants. Examples thereof include halogen flame-retardants such as a brominated epoxy resin, brominated polycarbonate, brominated polystyrene, brominated styrene, brominated phthalimide, tetrabromobisphenol A, pentabromobenzyl (meth)acrylate, pentabromotoluene, tribromophenol, hexabromobenzene, decabromodiphenylether, chlorinated polystyrene and chlorinated paraffin, phosphorus flame-retardants such as red phosphorus, tricresyl phosphate, triphenyl phosphate, cresyldiphenyl phosphate, trixylyl phosphate, trialkyl phosphate, dialkyl phosphate, tris(chloroethyl) phosphate and phosphazene, and inorganic flame-retardants such as aluminum hydroxide, magnesium hydroxide, zinc borate and antimony trioxide. These flame-retardants may be used alone or in combination.

Examples of the filler include fibrous fillers such as a glass fiber, a carbon fiber, an aramid fiber, a silicone carbide fiber, an alumina fiber and a boron fiber, inorganic whiskers such as silicone carbide, silicon nitride, magnesium oxide, potassium titanate and aluminoborate, inorganic acicular fillers such as wollastonite, sonolite, a phosphate fiber and sepiolite, inorganic spherical fillers such as pulverized silica, fused silica, talc, alumina, bariumtitanate, mica and glass beads, and organic fillers such as particulate polymers obtainable by crosslinking of (meth)acrylic acid ester, styrene, etc. These fillers may be used alone or in combination.

Examples of the coupling agent include silane type coupling agents such as vinyltrichlorosilane, vinyltriethoxysilane, vinyltrimethoxysilane, γ-methacryloxypropyltrimethoxysilane, β(3,4-epoxycyclohexyl) ethyltrimethoxysilane, γ-glycidoxypropylmethyldiethoxysilane, N-β(aminoethyl)γ-aminopropylmethylmethoxysilane, γ-aminopropyltriethoxysilane, N-phenyl-γ-aminopropyltrimethoxysilane, γ-mercaptopropyltrimethoxysilane and γ-chloropropyltrimethoxysilane, titanate type coupling agents, aluminum type coupling agents, zircoaluminate type coupling agents, silicone type coupling agents and fluorine type coupling agents. These coupling agents may be used alone or in combination.

Examples of the thermosetting resin include epoxy resins such as bisphenol A type epoxy, bisphenol F type epoxy, phenol novolak type epoxy, cresol novolak type epoxy and dicyclopentadiene novolak type epoxy, (meth)acrylates such as bisphenol A type epoxy (meth)acrylate, phenol novolak type epoxy (meth)acrylate, trimethylolpropane tri(meth)acrylate and dipentaerythritol hexa (meth)acrylate, vinyl compounds such as styrene, divinylbenzene and divinylnaphthalene, cyanate resins such as bisphenol A dicyanate, tetramethylbisphenol F dicyanate, bisphenol M dicyanate and phenol novolak cyanate, an oxetane resin, a benzocyclobutene resin and a benzooxazine resin. These thermosetting resins may be used alone or in combination.

Then, the curable film of the present invention will be explained. The curable film of the present invention can be obtained by processing the curable resin composition of the present invention into a film form. The method of processing the curable resin composition into a film form is, for example, a method in which the curable resin composition is dissolved in a solvent, the thus-obtained resin composition solution is applied to a release film or a conductor foil such as a copper foil and then the applied solution is dried.

Examples of the solvent to be used include acetone, methyl ethyl ketone, ethylene glycol monomethyl ether acetate, propylene glycol dimethyl ether, toluene, xylene, tetrahydrofuran and N,N-dimethylfolmamide. The solvent shall not be limited to these examples. These solvents may be used alone or in combination.

The drying conditions for drying the solvent are not specially limited. However, when the temperature for the drying is too low, the solvent is apt to remain in the curable film. When it is too high, the vinyl compound undergoes curing. Therefore, it is preferred to carry out the drying at a temperature of from 40° C. to 150° C. for from 1 to 90 minutes. The thickness of the curable film can be adjusted by the concentration of the resin composition solution and the application thickness. When the application thickness is too thick, the solvent is apt to remain at the drying time. Therefore, the thickness of the curable film is preferably from 0.1 to 500 μm.

The film of the present invention can be obtained by curing the curable film of the present invention under heat. The curing conditions vary depending upon the presence or absence of the polymerization initiator and the presence or absence of combinational use of other thermosetting resin. The curing is preferably carried out at a temperature of from 150° C. to 250° C. for from 0.5 to 5 hours. Further, a pressure may be applied as required.

EXAMPLES

The present invention will be specifically explained with reference to Examples and Comparative Examples hereinafter, while the present invention shall not be limited to these Examples. Measuring methods are as follows.

1) A number average molecular weight and a weight average molecular weight were obtained by the gel permeation chromatography (GPC) method. Data processing was carried out according to the GPC curve and molecular weight calibration curve of a sample. The molecular weight calibration curve was obtained by making an approximation of a relation between the molecular weight of a standard polystyrene and the dissolution time thereof with the following equation, $$\text{Log } M = A_0 X^3 + A_1 X^2 + A_2 X + A_3 + A_4/X^2$$

wherein M: a molecular weight, X: an elution time −19 (minute), and A: a coefficient.

2) A hydroxyl group equivalent was determined from an absorption intensity at 3,600 cm$^{-1}$ in an IR analysis (solution cell method; cell thickness=1 mm) using 2,6-dimethylphenol as a standard reference material and using dry dichloromethane as a solvent.

3) With regard to an appearance, the appearance of a curable film was visually observed to check the presence or absence of a crack.

○: No crack, x: Crack occurred.

4) With regard to tackiness, the presence or absence of tackiness of a curable film at 25° C. was judged by touching the film with fingers.

○: Not tacky, x: Tacky.

5) A glass transition temperature was measured at a load of 5 g, at a span of 10 mm and at a temperature-increasing rate of 10° C./min according to the TMA tensile method.

6) With regard to a dielectric constant and a dielectric loss tangent, values at 10 GHz were measured by a cavity resonance perturbation method.

7) With regard to chemical resistance, a film was immersed in toluene at 25° C. for 24 hours and a change in appearance was observed.

○: No change, x: Dissolved.

8) With regard to flexibility, a film was cut to prepare a strip having a width of 15 mm and a length of 100 mm, the strip was bent by 180° in the major axis direction, a 2-kg cylindrical weight having a flat bottom surface and having a diameter of 70 mm was placed on the crease of the strip for 30 seconds, and the presence or absence of a crack was observed.

○: No crack, x: Crack found.

SYNTHETIC EXAMPLE 1

Synthesis of Bifunctional Phenylene Ether Oligomer

A longitudinally long reactor having a volume of 12 liters and equipped with a stirrer, a thermometer, an air-introducing tube and baffleplates was charged with 3.88 g (17.4 mmol) of CuBr$_2$, 0.75 g (4.4 mmol) of N,N'-di-t-butylethylenediamine, 28.04 g (277.6 mmol) of n-butyldimethylamine and 2,600 g of toluene. The components were stirred at a reaction temperature of 40° C. A mixed solution was obtained by dissolving 129.32 g (0.48 mol) of 2,2', 3,3', 5,5'-hexamethyl-(1,1'-biphenyl)-4,4'-diol, 292.19 g (2.40 mol) of 2,6-dimethylphenol, 0.51 g (2.9 mmol) of N,N'-di-t-butylethylenediamine and 10.90 g (108.0 mmol) of n-butyldimethylamine in 2,300 g of methanol in advance. The mixed solution was dropwise added to the mixture in the reactor over 230 minutes while carrying out bubbling with 5.2 L/min of a nitrogen-air mixed gas having an oxygen concentration of 8%, and stirring was carried out. After the completion of the addition, 1,500 g of water in which 19.89 g (52.3 mmol) of tetrasodium ethylenediamine tetraacetate was dissolved was added to the stirred mixture to terminate the reaction. An aqueous layer and an organic layer were separated. Then, the organic layer was washed with 1N hydrochloric acid aqueous solution and then washed with pure water. The thus-obtained solution was concentrated to 50 wt % with an evaporator, to obtain 833.40 g of a toluene solution of a bifunctional phenylene ether oligomer (resin "A"). The resin "A" had a number average molecular weight of 930, a weight average molecular weight of 1,460 and a hydroxyl group equivalent of 465.

Synthesis of Vinyl Compound

A reactor equipped with a stirrer, a thermometer and a reflux tube was charged with 833.40 g of the toluene solution of the resin "A", 160.80 g of vinylbenzyl chloride (CMS-P; supplied by Seimi Chemical Co., Ltd.), 1,600 g of methylene chloride, 12.95 g of benzyldimethylamine, 420 g of pure water and 175.9 g of 30.5 wt % NaOH aqueous solution, and the mixture was stirred at a reaction temperature of 40° C. The stirring was carried out for 24 hours, and then an organic layer was washed with 1N hydrochloric acid aqueous solution and then washed with pure water. The thus-obtained solution was concentrated with an evaporator, and the concentrated solution was dropwise added to methanol to obtain a solid. The solid was recovered by filtering, and the recovered solid was dried in vacuum to obtain 501.43 g of a vinyl compound "B". The vinyl compound "B" had a number average molecular weight of 1,165 and a weight average molecular weight of 1,630.

SYNTHETIC EXAMPLE 2

Synthesis of Bifunctional Phenylene Ether Oligomer

A longitudinally long reactor having a volume of 12 liters and equipped with a stirrer, a thermometer, an air-introducing tube and baffleplates was charged with 9.36 g (42.1 mmol) of $CuBr_2$, 1.81 g (10.5 mmol) of N,N'-di-t-butylethylenediamine, 67.77 g (671.0 mmol) of n-butyldimethylamine and 2,600 g of toluene. The components were stirred at a reaction temperature of 40° C. A mixed solution was obtained by dissolving 129.32 g (0.48 mol) of 2,2', 3,3', 5,5'-hexamethyl-(1,1'-biphenyl)-4,4'-diol, 878.4 g (7.2 mol) of 2,6-dimethylphenol, 1.22 g (7.2 mmol) of N,N'-di-t-butylethylenediamine and 26.35 g (260.9 mmol) of n-butyldimethylamine in 2,300 g of methanol in advance. The mixed solution was dropwise added to the mixture in the reactor over 230 minutes while carrying out bubbling with 5.2 L/min of a nitrogen-air mixed gas having an oxygen concentration of 8%, and stirring was carried out. After the completion of the addition, 1,500 g of water in which 48.06 g (126.4 mmol) of tetrasodium ethylenediamine tetraacetate was dissolved was added to the stirred mixture to terminate the reaction. An aqueous layer and an organic layer were separated. Then, the organic layer was washed with 1N hydrochloric acid aqueous solution and then washed with pure water. The thus-obtained solution was concentrated to 50 wt % with an evaporator, to obtain 1,981 g of a toluene solution of a bifunctional phenylene ether oligomer (resin "C"). The resin "C" had a number average molecular weight of 1,975, a weight average molecular weight of 3,514 and a hydroxyl group equivalent of 990.

Synthesis of Vinyl Compound

A reactor equipped with a stirrer, a thermometer and a reflux tube was charged with 833.40 g of the toluene solution of the resin "C", 76.7 g of vinylbenzyl chloride (CMS-P), 1,600 g of methylene chloride, 6.2 g of benzyldimethylamine, 199.5 g of pure water and 83.6 g of 30.5 wt % NaOH aqueous solution, and the mixture was stirred at a reaction temperature of 40° C. The stirring was carried out for 24 hours, and then an organic layer was washed with 1N hydrochloric acid aqueous solution and then washed with pure water. The thus-obtained solution was concentrated with an evaporator, and the concentrated solution was dropwise added to methanol to obtain a solid. The solid was recovered by filtering, and the recovered solid was dried in vacuum to obtain 450.1 g of a vinyl compound "D". The vinyl compound "D" had a number average molecular weight of 2,250 and a weight average molecular weight of 3,920.

SYNTHETIC EXAMPLE 3

Synthesis of Bifunctional Phenylene Ether Oligomer

A longitudinally long reactor having a volume of 12 liters and equipped with a stirrer, a thermometer, an air-introducing tube and baffleplates was charged with 13.1 g (0.12 mol) of CuCl, 707.0 g (5.5 mol) of di-n-butylamine and 4,000 g of methyl ethyl ketone. The components were stirred at a reaction temperature of 40° C. A mixed solution was obtained by dissolving 410.2 g (1.6 mol) of 4,4'-methylenebis (2,6-dimethylphenol) and 586.5 g (4.8 mol) of 2,6-dimethylphenol in 8,000 g of methyl ethyl ketone in advance. The mixed solution was dropwise added to the mixture in the reactor while carrying out bubbling with 2 L/min of air, and stirring was carried out. A disodium dihydrogen ethylenediamine tetraacetate aqueous solution was added the stirred mixture to terminate the reaction. Then, washing was carried out with 1N hydrochloric acid aqueous solution and then washing was carried out with pure water. The thus-obtained solution was concentrated with an evaporator and then dried under a reduced pressure, to obtain 946.6 g of a bifunctional phenylene ether oligomer (resin "E"). The resin "E" had a number average molecular weight of 801, a weight average molecular weight of 1,081 and a hydroxyl group equivalent of 455.

Synthesis of Vinyl Compound

A reactor equipped with a stirrer, a thermometer and a reflux tube was charged with 480.0 g of the resin "E", 260.2 g of vinylbenzyl chloride (CMS-P), 2,000 g of tetrahydrofuran, 240.1 g of potassium carbonate and 60.0 g of 18-crown-6-ether, and the mixture was stirred at a reaction temperature of 30° C. After 6 hours stirring, the mixture was concentrated with an evaporator, diluted with 2,000 g of toluene and then washed with water. An organic layer was concentrated and then dropped into methanol to obtain a solid. The solid was recovered by filtering, and the recovered solidwas dried in vacuum to obtain 392.2 g of a vinyl compound "F". The vinyl compound "F" had a number average molecular weight of 988 and a weight average molecular weight of 1,420.

SYNTHETIC EXAMPLE 4

Synthesis of Bifunctional Phenylene Ether Oligomer

A longitudinally long reactor having a volume of 12 liters and equipped with a stirrer, a thermometer, an air-introducing tube and baffleplates was charged with 13.1 g (0.12 mol) of CuCl, 707.0 g (5.5 mol) of di-n-butylamine and 4,000 g of methyl ethyl ketone. The components were stirred at a reaction temperature of 40° C. A mixed solution was obtained by dissolving 82.1 g (0.32 mol) of 4,4'-methylenebis (2,6-dimethylphenol) and 586.5 g (4.8 mol) of 2,6-dimethylphenol in 8,000 g of methyl ethyl ketone in advance. The mixed solution was dropwise added to the mixture in the reactor while carrying out bubbling with 2 L/min of air, and stirring was carried out. A disodium dihydrogen ethylenediamine tetraacetate aqueous solution was added to the stirred mixture, to terminate the reaction. Then, washing was carried out with 1N hydrochloric acid aqueous solution and then washing was carried out with pure water. The thus-obtained solution was concentrated with an evaporator and then dried under a reduced pressure, to obtain 632.5 g of a bifunctional phenylene ether oligomer (resin "G"). The resin "G" had a number average molecular weight of 1,884, a weight average molecular weight of 3,763 and a hydroxyl group equivalent of 840.

Synthesis of Vinyl Compound

A reactor equipped with a stirrer, a thermometer and a reflux tube was charged with 480.0 g of the resin "G", 140.5 g of vinylbenzyl chloride (CMS-P), 2,000 g of tetrahydrofuran, 129.6 g of potassium carbonate and 32.4 g of 18-crown-6-ether, and the mixture was stirred at a reaction temperature of 30° C. After 6 hours stirring, the mixture was concentrated with an evaporator, diluted with 2,000 g of toluene and then washed with water. An organic layer was concentrated and then dropped into methanol to obtain a solid. The solid was recovered by filtering, and the recovered solid was dried in vacuum to obtain 415.3 g of a vinyl compound "H". The vinyl compound "H" had a number average molecular weight of 2,128 and a weight average molecular weight of 4,021.

EXAMPLES 1 TO 7 AND COMPARATIVE EXAMPLES 1 TO 5

One of the vinyl compound "B" obtained in Synthetic Example 1, the vinyl compound "D" obtained in Synthetic Example 2, the vinyl compound "F" obtained in Synthetic Example 3 and divinylbenzene (DVB-960: supplied by Nippon Steel Chemical Group) and/or one of various high molecular weight compounds in amounts shown in Table 1 were dissolved in toluene, to obtain a varnish having a resin solid content of 30 wt % (15 wt % in Examples 3, 4 and 5). The varnish was applied to a 18-μm electrolytic copper foil (3EC-III: supplied by MITSUI MINING & SMELTING CO., LTD) with a doctor blade (space 75 μm) and the applied varnish was dried at 50° C. for 5 minutes to obtain a copper-foil-attached curable film having a resin layer thickness of about 15 μm. The thus-obtained copper-foil-attached curable film was evaluated for its appearance and the presence or absence of tackiness. Table 1 shows the results. Then, the copper-foil-attached curable film was heated in an inert oven under nitrogen at a temperature-increasing rate of 4° C./minute at 200° C. for 90 minutes and then the copper foil was removed by etching to obtain a film. The film had a thickness of about 15 μm. The film was evaluated for a glass transition temperature, a dielectric constant, a dielectric loss tangent, chemical resistance and flexibility. Table 2 shows the results.

TABLE 1

| | | Ex. 1 | Ex. 2 | Ex. 3 | Ex. 4 | Ex. 5 | Ex. 6 |
|---|---|---|---|---|---|---|---|
| Curing | Resin B | 70 | 70 | 85 | 85 | 85 | — |
| component | Resin D | — | — | — | — | — | 70 |
| | Resin F | — | — | — | — | — | — |
| | Divinyl-benzene | — | — | — | — | — | — |
| High | TR2003 | — | — | — | — | — | 30 |
| molecular | TR2827 | 30 | — | — | — | — | — |
| weight | SIS5229 | — | 30 | — | — | — | — |
| compound | SEPTON2006 | — | — | 15 | — | — | — |
| | SEPTON4055 | — | — | — | 15 | — | — |
| | SEPTON8007 | — | — | — | — | 15 | — |
| | Appearance | ○ | ○ | ○ | ○ | ○ | ○ |
| | Tackiness | ○ | ○ | ○ | ○ | ○ | ○ |

| | | EX. 7 | CEx. 1 | CEx. 2 | CEx. 3 | CEx. 4 | CEx. 5 |
|---|---|---|---|---|---|---|---|
| Curing | Resin B | — | 100 | — | — | — | — |
| component | Resin D | — | — | 100 | — | — | — |
| | Resin F | 70 | — | — | 100 | — | — |
| | Divinyl-benzene | — | — | — | — | 70 | — |
| High | TR2003 | 30 | — | — | — | 30 | 100 |
| molecular | TR2827 | — | — | — | — | — | — |
| weight | SIS5229 | — | — | — | — | — | — |
| compound | SEPTON2006 | — | — | — | — | — | — |
| | SEPTON4055 | — | — | — | — | — | — |
| | SEPTON8007 | — | — | — | — | — | — |
| | Appearance | ○ | X | X | X | ○ | ○ |
| | Tackiness | ○ | ○ | ○ | ○ | X | ○ |

Ex. = Example,
CEx. = Comparative Example

TR2003, TR2827: Styrene butadiene styrene copolymer (weight average molecular weight: about 100,000, supplied by JSR)

SIS5229: Styrene isoprene styrene copolymer (weight average molecular weight: about 200,000, supplied by JSR)

SEPTON2006: Hydrogenated styrene isoprene styrene copolymer (weight average molecular weight: about 200,000, supplied by KURARAY Co., Ltd.)

SEPTON4055: Hydrogenated styrene (butadiene/isoprene) styrene copolymer (weight average molecular weight: about 200,000, supplied by KURARAY Co., Ltd.)

SEPTON8007: Hydrogenated styrene butadiene styrene copolymer (weight average molecular weight: about 100,000, supplied by KURARAY Co., Ltd.)

TABLE 2

|  | Ex. 1 | Ex. 2 | Ex. 3 | Ex. 4 |
| --- | --- | --- | --- | --- |
| Glass transition temperature (° C.) | 179 | 183 | 185 | 184 |
| Dielectric constant (10 GHz) | 2.44 | 2.43 | 2.43 | 2.45 |
| Dielectric loss tangent (10 GHz) | 0.0023 | 0.0024 | 0.0025 | 0.0025 |
| Chemical resistance | ○ | ○ | ○ | ○ |
| Flexibility | ○ | ○ | ○ | ○ |

|  | Ex. 5 | Ex. 6 | Ex. 7 | CEx. 5 |
| --- | --- | --- | --- | --- |
| Glass transition temperature (° C.) | 187 | 175 | 169 | 72 |
| Dielectric constant (10 GHz) | 2.44 | 2.44 | 2.42 | 2.30 |
| Dielectric loss tangent (10 GHz) | 0.0026 | 0.0024 | 0.0022 | 0.0022 |
| Chemical resistance | ○ | ○ | ○ | X |
| Flexibility | ○ | ○ | ○ | ○ |

Ex. = Example,
CEx. = Comparative Example

EXAMPLES 8 TO 19

One of the vinyl compound "D" obtained in Synthetic Example 2, the vinyl compound "F" obtained in Synthetic Example 3 and the vinyl compound "H" obtained in Synthetic Example 4 and one of various high molecular weight compounds were mixed in a vinyl compound: high molecular weight compound weight ratio of 70:30, and the mixture was dissolved in toluene, to obtain a varnish having a resin solid content of 20 wt %. The varnish was applied to a PET film (Lumirror-T: supplied by Toray Industries, Inc.) having a thickness of 100 μm with a doctor blade (space 300 μm) and the applied varnish was dried at 80° C. for 5 minutes to obtain a curable film having a resin layer thickness of about 30 μm. The thus-obtained curable film was evaluated for its appearance and tackiness. Then, the curable film was heated in an inert oven under nitrogen at a temperature-increasing rate of 4° C./minute at 200° C. for 30 minutes and then the PET film was removed by hand to obtain a film. The film had a thickness of about 30 μm. The film was evaluated for a glass transition temperature, a dielectric constant, a dielectric loss tangent, chemical resistance and flexibility. Table 3 shows the results.

TABLE 3

|  | Ex. 8 | Ex. 9 | Ex. 10 | Ex. 11 | Ex. 12 | Ex. 13 |
| --- | --- | --- | --- | --- | --- | --- |
| Vinyl compound | Resin D | Resin D | Resin D | Resin D | Resin D | Resin D |
| High molecular weight compound | TR2250 | TR2827 | HYBRAR 5127 | SEPTON 2104 | SEPTON 2007 | SEPTON 4033 |
| Kind of High molecular weight compound | SBS | SBS | SIS | Hydro-SIS | Hydro-SIS | SEEPS |
| Styrene content (wt %) in High molecular weight compound | 52 | 24 | 20 | 65 | 30 | 30 |
| Appearance of curable film | ○ | ○ | ○ | ○ | ○ | ○ |
| Tackiness of curable film | ○ | ○ | ○ | ○ | ○ | ○ |
| Glass transition temperature (° C.) | 171 | 174 | 185 | 181 | 205 | 192 |
| Dielectric constant (10 GHz) | 2.54 | 2.41 | 2.48 | 2.53 | 2.46 | 2.48 |
| Dielectric loss tangent (10 GHz) | 0.0024 | 0.0023 | 0.0021 | 0.0023 | 0.0019 | 0.0018 |

TABLE 3-continued

|  | Ex. 14 | Ex. 15 | Ex. 16 | Ex. 17 | Ex. 18 | Ex. 19 |
|---|---|---|---|---|---|---|
| Chemical resistance | ○ | ○ | ○ | ○ | ○ | ○ |
| Flexibility | ○ | ○ | ○ | ○ | ○ | ○ |
| Vinyl compound | Resin D | Resin D | Resin D | Resin D | Resin F | Resin H |
| High molecular weight compound | HYBRAR 7125 | SEPTON 8104 | Tuftec H1051 | Tuftec H1053 | Tuftec H1053 | Tuftec H1053 |
| Kind of High molecular weight compound | Hydro-SIS | Hydro-SBS | Hydro-SBS | Hydro-SBS | Hydro-SBS | Hydro-SBS |
| Styrene content (wt %) in High molecular weight compound | 20 | 60 | 42 | 29 | 29 | 29 |
| Appearance of curable film | ○ | ○ | ○ | ○ | ○ | ○ |
| Tackiness of curable film | ○ | ○ | ○ | ○ | ○ | ○ |
| Glass transition temperature (° C.) | 200 | 181 | 199 | 206 | 191 | 205 |
| Dielectric constant (10 GHz) | 2.45 | 2.51 | 2.49 | 2.45 | 2.42 | 2.44 |
| Dielectric loss tangent (10 GHz) | 0.0021 | 0.0022 | 0.0017 | 0.0018 | 0.0023 | 0.0021 |
| Chemical resistance | ○ | ○ | ○ | ○ | ○ | ○ |
| Flexibility | ○ | ○ | ○ | ○ | ○ | ○ |

Ex. = Example,
Hydro-SIS = Hydrogenated SIS,
Hydro-SBS = Hydrogenated SBS

TR2250: Styrene butadiene styrene copolymer (SBS) (Supplied by JSR, weight average molecular weight: about 100,000)

HYBRAR5127: Styrene isoprene styrenecopolymer (SIS) (supplied by KURARAY Co., Ltd., weight average molecular weight: about 120,000)

HYBRAR7125: Hydrogenated styrene isoprene styrene copolymer (Hydrogenated SIS) (supplied by KURARAY Co., Ltd., weight average molecular weight: about 100,000)

SEPTON2104: Hydrogenated styrene isoprene styrene copolymer (Hydrogenated SIS) (supplied by KURARAY Co., Ltd., weight average molecular weight: about 90,000)

SEPTON2007: Hydrogenated styrene isoprene styrene copolymer (Hydrogenated SIS) (supplied by KURARAY Co., Ltd., weight average molecular weight: about 80,000)

SEPTON4033: Hydrogenated styrene (butadiene/isoprene) styrene copolymer (SEEPS) (supplied by KURARAY Co., Ltd., weight average molecular weight: about 100,000)

SEPTON8104: Hydrogenated styrene butadiene styrene copolymer (Hydrogenated SBS) (supplied by KURARAY Co., Ltd., weight average molecular weight: about 120,000)

Tuftec H1051: Hydrogenated styrene butadiene styrene copolymer (Hydrogenated SBS) (supplied by Asahi Kasei Corporation, weight average molecular weight: about 70,000)

Tuftec H1053: Hydrogenated styrene butadiene styrene copolymer (Hydrogenated SBS) (supplied by Asahi Kasei Corporation, weight average molecular weight: about 70,000)

EXAMPLES 20 TO 22

The vinyl compound "D" obtained in Synthetic Example 2 and one of various high molecular weight compounds were mixed in a vinyl compound "D": high molecular weight compound weight ratio of 50:50, and the mixture was dissolved in toluene to prepare a varnish having a resin solid content of 20 wt %. The varnish was applied to a PET film (Lumirror-T) having a thickness of 100 μm with a doctor blade (space 300 μm) and the applied varnish was dried at 80° C. for 5 minutes to obtain a curable film having a resin layer thickness of about 30 μm. The thus-obtained curable film was evaluated for its appearance and tackiness. Then, the curable film was heated in an inert oven under nitrogen at a temperature-increasing rate of 4° C./minute at 200° C. for 30 minutes and then the PET film was removed by hand to obtain a film. The film had a thickness of about 30 μm. The film was evaluated for a glass transition temperature, a dielectric constant, a dielectric loss tangent, chemical resistance and flexibility. Table 4 shows the results.

TABLE 4

|  | Example 20 | Example 21 | Example 22 |
|---|---|---|---|
| Vinyl compound | Resin D | Resin D | Resin D |
| High molecular weight compound | TR2003 | Tuftec H1051 | Tuftec H1053 |
| Kind of High molecular weight compound | SBS | Hydrogenated SBS | Hydrogenated SBS |
| Styrene content (wt %) in High molecular weight compound | 43 | 42 | 29 |
| Appearance of curable film | ○ | ○ | ○ |
| Tackiness of curable film | ○ | ○ | ○ |
| Glass transition temperature (° C.) | 162 | 185 | 199 |
| Dielectric constant (10 GHz) | 2.38 | 2.39 | 2.41 |
| Dielectric loss tangent (10 GHz) | 0.0022 | 0.0017 | 0.0016 |
| Chemical resistance | ○ | ○ | ○ |
| Flexibility | ○ | ○ | ○ |

EXAMPLES 23 TO 25

The vinyl compound "D" obtained in Synthetic Example 2 and one of various high molecular weight compounds were mixed in a vinyl compound "D": high molecular weight compound weight ratio of 30:70, and the mixture was dissolved in toluene to prepare a varnish having a resin solid content of 20 wt %. The varnish was applied to a PET film (Lumirror-T) having a thickness of 100 μm with a doctor blade (space 300 μm) and the applied varnish was dried at 80° C. for 5 minutes to obtain a curable film having a resin layer thickness of about 30 μm. The thus-obtained curable film was evaluated for its appearance and tackiness. Then, the curable film was heated in an inert oven under nitrogen at a temperature-increasing rate of 4° C./minute at 200° C. for 30 minutes and then the PET film was removed by hand to obtain a film. The film had a thickness of about 30 μm. The film was evaluated for a glass transition temperature, a dielectric constant, a dielectric loss tangent, chemical resistance and flexibility. Table 5 shows the results.

TABLE 5

|  | Example 23 | Example 24 | Example 25 |
|---|---|---|---|
| Vinyl compound | Resin D | Resin D | Resin D |
| High molecular weight compound | TR2003 | Tuftec H1051 | Tuftec H1053 |
| Kind of High molecular weight compound | SBS | Hydrogenated SBS | Hydrogenated SBS |
| Styrene content (wt %) in High molecular weight compound | 43 | 42 | 29 |
| Appearance of curable film | ◯ | ◯ | ◯ |
| Tackiness of curable film | ◯ | ◯ | ◯ |
| Glass transition temperature (° C.) | 138 | 172 | 177 |
| Dielectric constant (10 GHz) | 2.42 | 2.41 | 2.39 |
| Dielectric loss tangent (10 GHz) | 0.0029 | 0.0019 | 0.0020 |
| Chemical resistance | ◯ | ◯ | ◯ |
| Flexibility | ◯ | ◯ | ◯ |

EXAMPLE 26

A curable resin composition toluene solution having a resin solid content of 20 wt % and having the constitution of Example 19 was applied to a 18-μm electrolytic copper foil (3EC-III) with a doctor blade (space 400 μm) and the applied solution was dried with an air dryer at 80° C. for 5 minutes, whereby copper-foil-attached curable films having a resin layer thickness of about 40 μm each were obtained. The thus-obtained copper-foil-attached curable films were placed on both surfaces, which had been patterned, of a core material (EL190, copper foil thickness 18 μm, supplied by Mitsubishi Gas Chemical Co., Inc.), one film on one surface and the other film on the other surface, and the resultant set was cured under heat at a temperature of 200° C. and under a pressure of 2 MPa for 2 hours, to prepare a four-layered board. The copper foil peeling strength of the outermost copper foils was 0.8 kN/m. Further, the outermost copper foils were removed by etching, and it was found that internal layer patterns were buried without any voids.

What is claimed is:

1. A curable resin composition consisting of a high molecular weight compound having a weight average molecular weight of 70,000 to 300,00 and a vinyl compound of the formula (1),

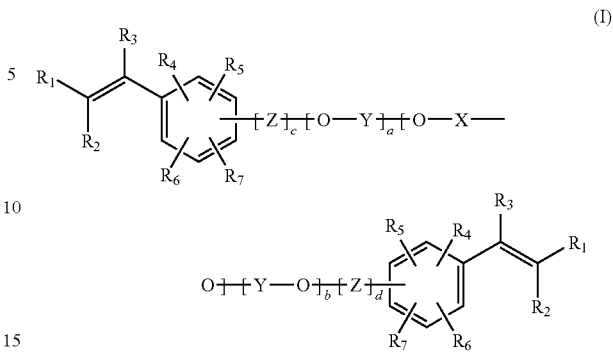

wherein the high molecular weight compound is at least one compound selected from the group consisting of a styrene isoprene styrene copolymer, a hydrogenated styrene butadiene styrene copolymer, a hydrogenated styrene isoprene styrene copolymer and a hydrogenated styrene (butadiene/isoprene) styrene copolymer, wherein the styrene content in the high molecular weight compound is from 20 to 65% by weight and the weight ratio of the vinyl compound of the formula (1): the high molecular weight compound is 30:70 to 70:30, $R_1$, $R_2$, $R_3$, $R_4$, $R_5$, $R_6$ and $R_7$ are the same or different and represent a hydrogen atom, a halogen atom, an alkyl group or a halogenated alkyl group, —(O—X—O)— represents a moiety of the formula (2) or the formula (3) or represents at least two kinds of moieties of the formula (2) and/or the formula (3),

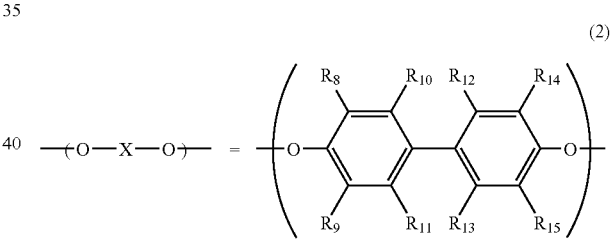

in which $R_8$, $R_9$, $R_{10}$, $R_{14}$ and $R_{15}$ are the same or different and represent a halogen atom, an alkyl group having 6 or less carbon atoms or a phenyl group and $R_{11}$, $R_{12}$ and $R_{13}$ are the same or different and represent a hydrogen atom, a halogen atom, an alkyl group having 6 or less carbon atoms or a phenyl group,

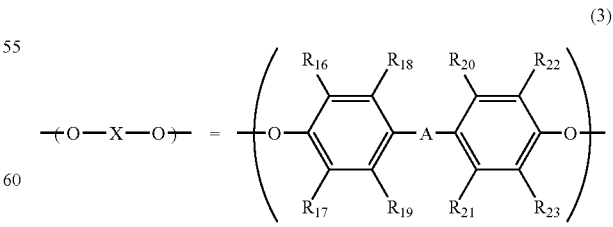

in which $R_{16}$, $R_{17}$, $R_{22}$ and $R_{23}$ are the same or different and represent a halogen atom, an alkyl group having 6 or less carbon atoms or a phenyl group, $R_{18}$, $R_{19}$, $R_{20}$ and $R_{21}$ are the same or different and represent a hydrogen atom, a halogen atom, an alkyl group having 6 or less carbon atoms or a phenyl group and A is a linear, branched or cyclic hydrocarbon having 20 or less carbon atoms, —(Y—O)— represents a moiety of the formula (4) or a random arrangement of at least two kinds of moieties of the formula (4),

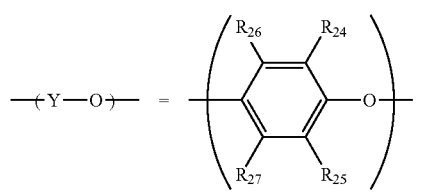
(4)

in which $R_{24}$ and $R_{25}$ are the same or different and represent a halogen atom, an alkyl group having 6 or less carbon atoms or a phenyl group and $R_{26}$ and $R_{27}$ are the same or different and represent a hydrogen atom, a halogen atom, an alkyl group having 6 or less carbon atoms or a phenyl group, Z represents an organic group having at least one carbon atom which may contain an oxygen atom, a nitrogen atom, a sulfur atom and/or a halogen atom, each of a and b is an integer of from 0 to 30, provided that at least one of a and b is not 0, and each of c and d is an integer of 0 or 1.

2. A curable resin composition according to claim 1, wherein —(O—X—O)— is a moiety of the formula (5) or the formula (6) and —(Y—O)— is a moiety of the formula (7) or the formula (8) or a random arrangement of moieties of the formula (7) and the formula (8),

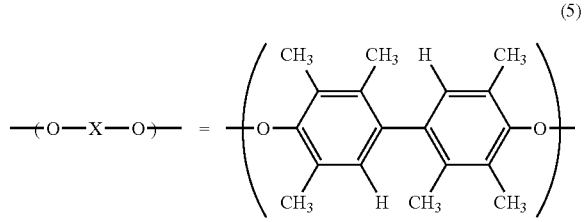
(5)

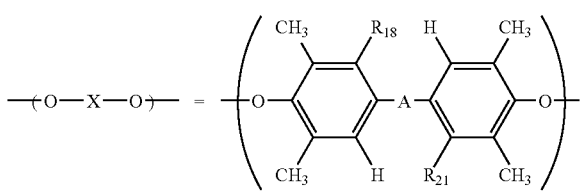
(6)

in which $R_{18}$ and $R_{21}$ represent a hydrogen atom or a methyl group and A is a linear, branched or cyclic hydrocarbon having 20 or less carbon atoms,

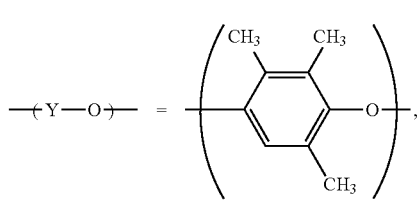
(7)

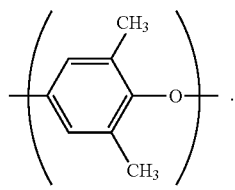
(8)

3. A curable resin composition according to claim 1, wherein the vinyl compound of the formula (1) has a number average molecular weight of from 500 to 3,000.

4. A curable film obtained by processing the curable resin composition recited in claim 1 into a film form.

5. A curable film according to claim 4, which has a conductor layer on at least one surface thereof.

6. A film obtained by curing the curable film recited in claim 4.

7. A film obtained by curing the curable film recited in claim 5.

* * * * *